United States Patent [19]

Berg et al.

[11] Patent Number: 4,967,175

[45] Date of Patent: Oct. 30, 1990

[54] INDUCTOR AND CARRIER SUITABLE FOR ATTACHING TO A HYBRID SUBSTRATE OR THE LIKE

[75] Inventors: William E. Berg; Jonathan C. Lueker, both of Portland, Oreg.

[73] Assignee: Tektronix, Inc., Beaverton, Oreg.

[21] Appl. No.: 435,212

[22] Filed: Nov. 13, 1989

[51] Int. Cl.$^5$ ............................................. H01F 15/02
[52] U.S. Cl. .................................... 336/65; 29/602.1; 336/192; 361/405
[58] Field of Search ............... 361/400, 405, 406, 409; 29/602.1, 605, 606; 336/65, 92, 192, 200, 229

[56] References Cited

U.S. PATENT DOCUMENTS

| | | | |
|---|---|---|---|
| 3,483,966 | 12/1969 | Dagnoli et al. | 336/65 X |
| 4,245,207 | 1/1981 | Murakami et al. | 336/65 |
| 4,498,067 | 2/1985 | Kumokawa et al. | 336/65 |
| 4,611,092 | 9/1986 | Pederson et al. | 174/52 |
| 4,650,545 | 3/1987 | Laakso et al. | 156/655 |

Primary Examiner—Thomas J. Kozma
Attorney, Agent, or Firm—Peter J. Meza

[57] ABSTRACT

An inductor and carrier suitable for mounting on a mounting substrate includes an etched sheet of a bonded copper layer and polyimide film to form a film carrier. The periphery of the film carrier is patterned with a plurality of windows and a plurality of conductors, each conductor having a bent-up tab and and end portion terminating at the periphery within the respective window. A microminiature inductor core having a plurality of insulated windings is soldered to the respective bent-up tab of each conductor and the end portion of each conductor is then welded to bonding pads on the mounting substrate.

12 Claims, 4 Drawing Sheets

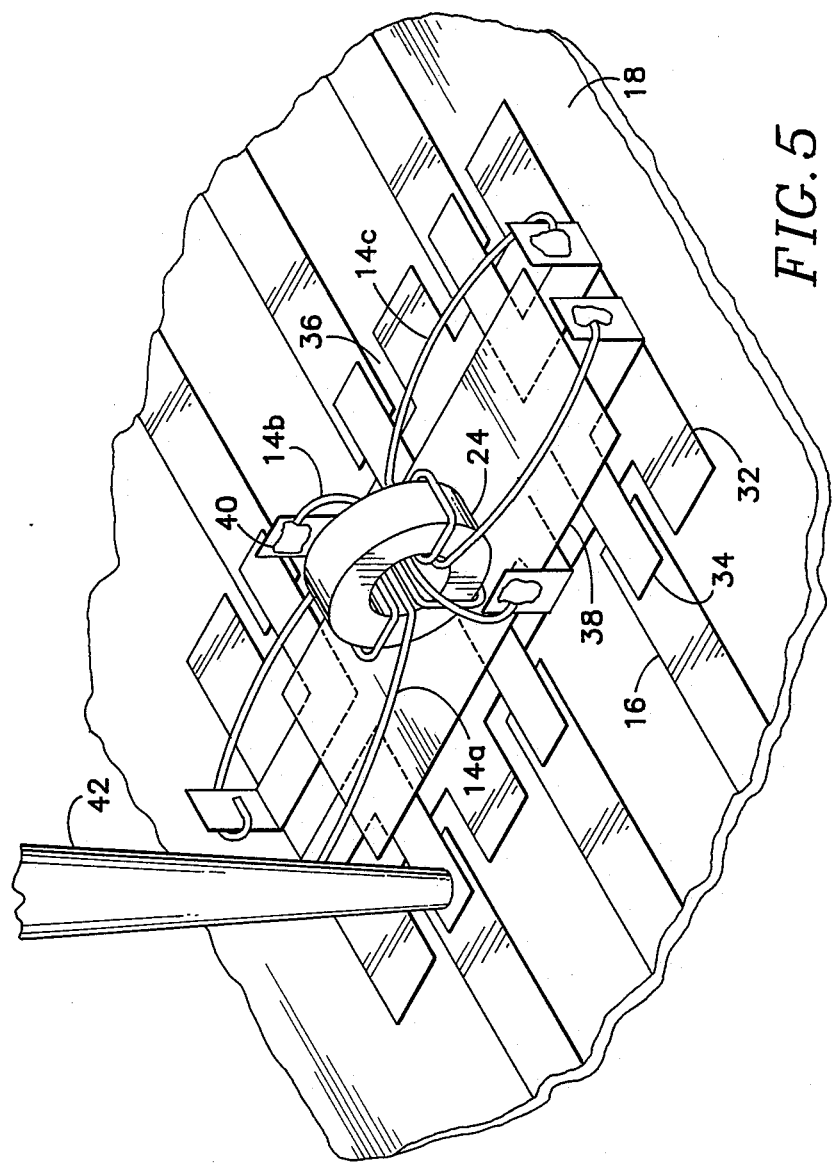

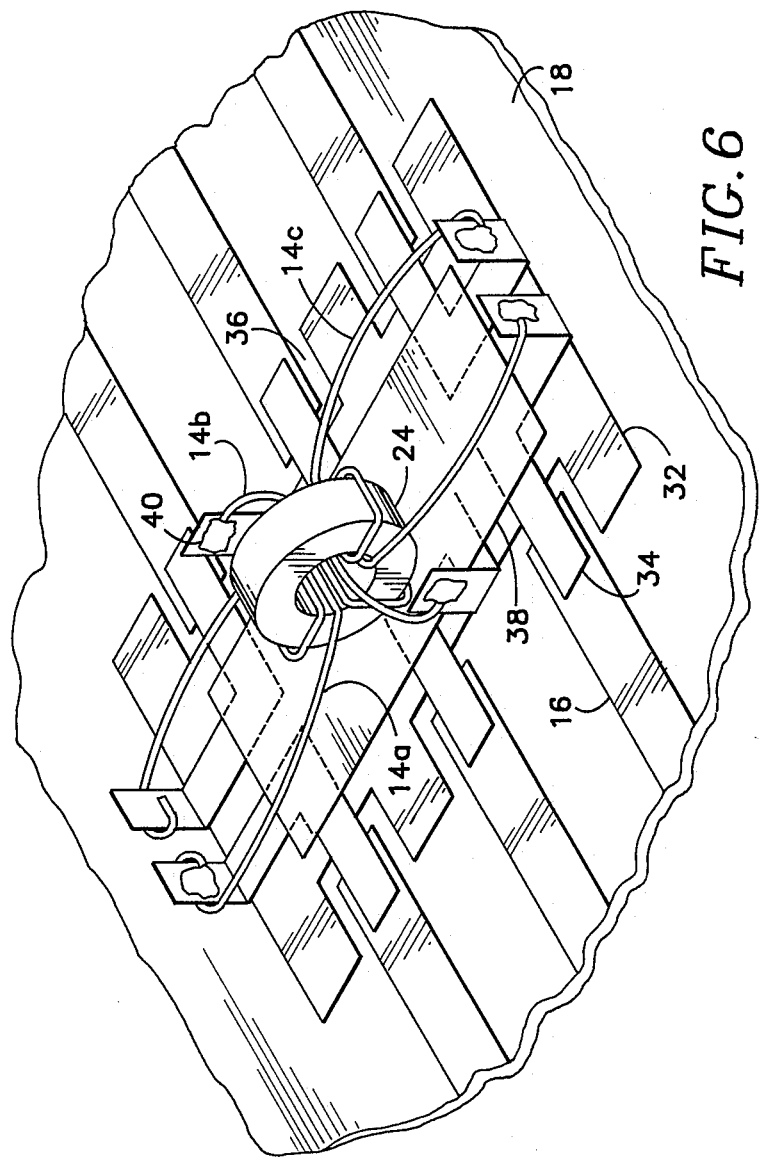

INDUCTOR AND CARRIER SUITABLE FOR ATTACHING TO A HYBRID SUBSTRATE OR THE LIKE

BACKGROUND OF THE INVENTION

This invention relates to microminiature inductive devices suitable for mounting on a mounting substrate such as a hybrid substrate or printed circuit board.

Prior art microminiature baluns, transformers and other inductive devices designed to be mounted to mounting substrates are fabricated with a small ceramic interconnect substrate that is attached to the mounting substrate with a conductive epoxy. This prior art epoxy attach method is illustrated in FIG. 1. Ceramic substrate 10 has metalized terminals 12 on the top surface interconnected to metalized terminals on the bottom surface (not shown) through metalized vias or plated through holes. The ceramic substrate 10 serves as an intermediate carrier wherein the windings 14 wrapped around inductor core 24 are soldered to the metalized terminals 12 of ceramic substrate 10 and the metalized terminals on the bottom surface are designed to mate with a matching terminal pattern 16 on the mounting substrate 18. The soldered wires are shown having soldered areas 20. When the ceramic substrate 10 is attached to the terminal pattern 16 with a conductive epoxy 22, two problems become apparent. The connection points to terminal pattern 16 are not visible from above since it is blocked by ceramic substrate 10 and the spreading of conductive epoxy 22 is not easy to control once the ceramic substrate has been placed on the mounting substrate 18. This prior art epoxy attach method may lead to shorting or an unreliable connection due to thermal stress. Further, the conductive epoxy has a relatively high impedance that is undesirable in many high current or high frequency applications.

Therefore, what is desired is an apparatus and method for joining a microminiature inductive device to a mounting substrate that is visible from above, does not have a tendency to short out or become unreliable due to thermal stress and does not use conductive epoxy.

SUMMARY OF THE INVENTION

In accordance with the present invention, an inductor and carrier suitable for mounting on a mounting substrate includes an etched sheet of a bonded copper layer and polyimide film to form a film carrier. The periphery of the film carrier is patterned with a plurality of windows and a plurality of conductors, each conductor having a bent-up tab and an end portion terminating at the periphery within the respective window. A microminiature inductor core having a plurality of insulated windings is soldered to the respective bent-up tabs of each conductor and the end portion of each conductor is then welded to bonding pads on the mounting substrate.

It is an advantage of the present invention that all connections are made with proven techniques including soldering and welding.

It is an advantage of the present invention that the polyimide material used for the film carrier is organic and yields rather than builds stress when thermally cycled.

It is a further advantage of the present invention that high impedance conductive epoxy is not used to make any of the electrical connections.

BRIEF DESCRIPTION OF THE DRAWINGS

FIG. 5 is a perspective view of a film carrier and attached inductive core being welded to a mounting substrate; and FIG. 6 is a perspective view of a film carrier and attached inductive core welded to a mounting substrate.

DESCRIPTION OF THE PREFERRED EMBODIMENT

Figure 1:
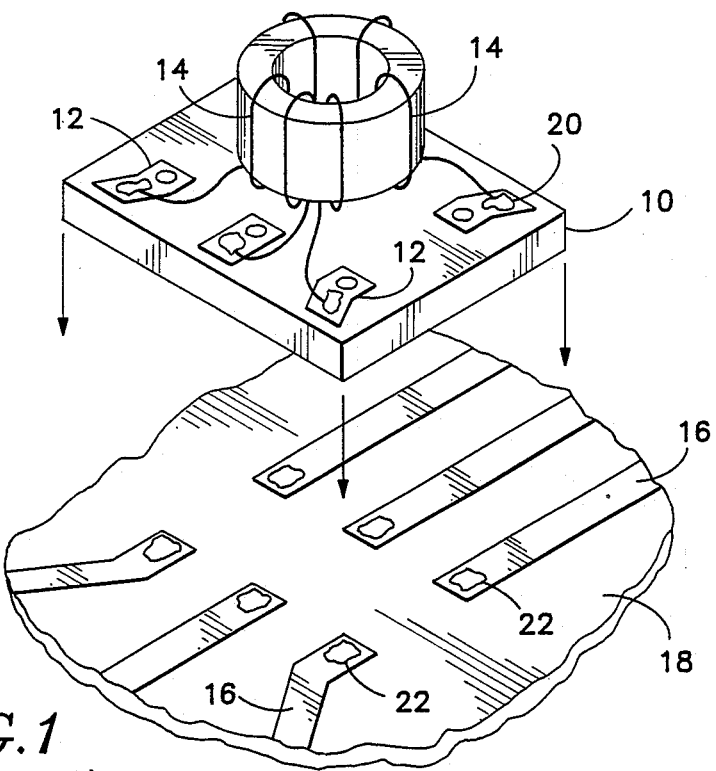
FIG. 1 is a perspective view of a prior art ceramic carrier prior to attachment to a mounting substrate.
Figure 2:
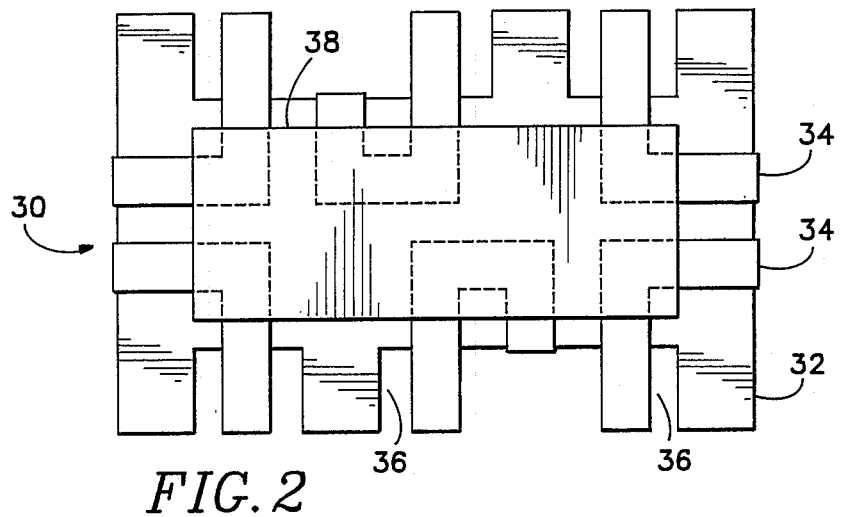
FIG. 2 is an overhead view of a polyimide or Teflon film carrier suitable for receiving a microminiature inductive device according to the present invention.

Referring to FIG. 2, the novel design includes a film substrate or carrier 30 fabricated from a sheet of copper directly bonded to polyimide or Teflon. Polyimide and Teflon are electrical insulators having desirable electrical characteristics and are capable of withstanding high temperatures. The polyimide material and the copper may both be photoetched. The polyimide material is etched in an alkaline solution and the copper is etched in an acid solution. Thus the film carrier may be preferentially etched in that one etching process does not affect the other. If Teflon is used, the unwanted material may be removed by laser skiving rather than photoetching. If desired, after the copper is etched it may be gold plated.

The film carrier 30 that has been fabricated using the photoetching process shows an etched polyimide film layer 32 and etched copper conductors 34 that may be gold plated over a nickel undercoat. Conductors 34 terminate in an end portion at the periphery of film carrier 30 within etched windows 36. The conductors 34 that do not extend beyond the boundary of the film layer 32 have been bent up to form a tab at a 90 degree angle relative to the plane of film carrier 30. A solder resist zone 38 is deposited atop the film layer 32 and conductors 34.

Figure 3:
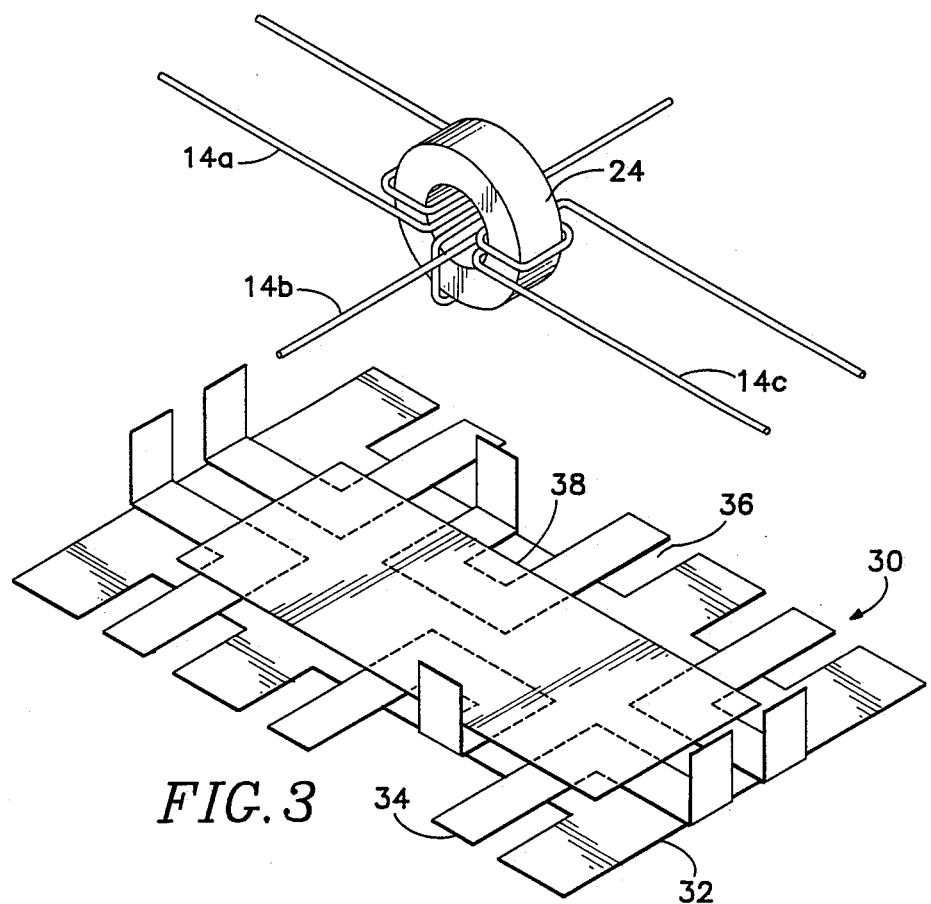
FIG. 3 is a perspective view of an inductive core and film carrier according to the present invention.

An inductor core 24 having a plurality of insulated windings 14a, 14b, and 14c is shown in FIG. 3 prior to being soldered to the internal terminations of conductors 34. Insulated winding 14b may be used as a primary winding of a transformer and windings 14a and 14c may be used as secondary windings of the transformer. The 90 degree termination of conductors 34 in a bent-up tab is now shown in the perspective view.

Figure 4:
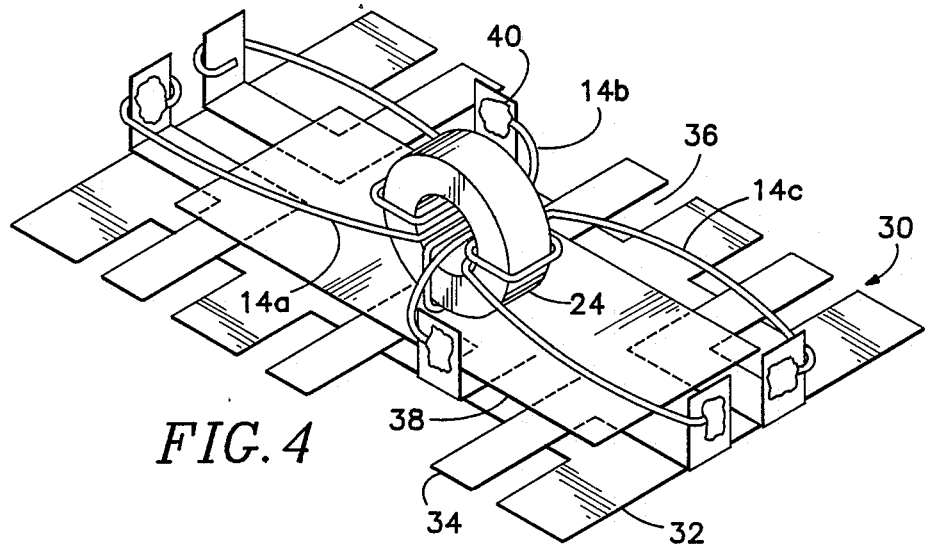
FIG. 4 is a perspective view of a film carrier and attached inductive core.

FIG. 4 shows inductor core 24 mounted on film carrier 30 with each winding 14a, 14b, and 14c being soldered to the respective bent-up tab of each conductor 34. The electrical connection between the windings 14 and the bent-up tabs of conductors 34 is shown as a solder areas 40. Solder resist zone 38 may be deposited on the middle portion of film carrier 30 before the insulated windings 14 are soldered to the respective bent-up tab of each conductor 34. Ideally, the deposited solder resist zone 38 is an organic high temperature epoxy material commonly used in the etched circuit board industry. Solder resist zone 38 inhibits solder from flowing to the other end portion of the conductors 34.

Referring now to FIG. 5, the completed assembly of the inductor core 24 and the film carrier 30 is placed atop mounting substrate 18. Note that terminal pattern 16 on the mounting substrate 18 is now visible through windows 36 in film carrier 30. The final assembly step is shown wherein the film carrier 30 is welded to terminal pattern 16 with a commercially available miniature parallel gap welder 42. The final welding step eliminates the use of soldering flux during late stages of assembly. Solder flux can be hard to remove and may attack other circuit components if moisture is present.

FIG. 6 shows the completed assembly of transformer core 24, film carrier 30, and mounting substrate 18. FIG. 6 also shows the final spatial relationship between the windows 36, the conductors 34, terminal pattern 16, and mounting substrate 18.

Typical dimensions for the film carrier 30 are 0.1 inch by 0.13 inch; the dimension for the minimum spacing between the conductors 34 is 0.025 inch; and the dimension for the width of a conductor 34 is 0.01 inch. These dimensions are mentioned only as typical dimensions for a film carrier suitable for receiving a microminiature inductive device and are not intended as limitations. The film carrier 30 may be scaled up or down according to the requirements of the intended application.

Thus it has been shown that an apparatus and method for joining a microminiature inductive device to a mounting substrate has been achieved wherein the bonding pads of the mounting substrate are visible from above during the assembly, the electrical connection does not have a tendency to short out or become unreliable due to thermal stress, and common bonding techniques such as soldering and welding are used, eliminating the need for high impedance conductive epoxy.

While I have shown and described a preferred embodiment of my invention, it will be apparent to those skilled in the art that many changes and modifications may be made without departing from my invention in its broader aspects.

I claim:

1. An inductor and carrier suitable for attaching to a mounting substrate comprising:
    (a) a film carrier having a periphery patterned with a plurality of windows and a plurality of conductors, each conductor having a bent-up tab and an end portion terminating at the periphery within the respective window for attachment to a mounting substrate; and
    (b) an inductor core having a plurality of insulated windings, each winding being attached to the respective bent-up tab of each conductor.

2. An inductor and carrier as in claim 1 wherein the film carrier is comprised of a polyimide material.

3. An inductor and carrier as in claim 1 wherein the film carrier is comprised of a Teflon material.

4. An inductor and carrier as in claim 1 wherein the conductors are comprised of gold plated nickel.

5. An inductor and carrier as in claim 1 wherein each inductor core winding is soldered to the respective bent-up tab of each conductor.

6. An inductor and carrier as in claim 4 wherein a solder resist zone is deposited on the middle portion of the film carrier.

7. A method for producing an inductor and carrier suitable for attaching to a mounting substrate comprising the steps of:
    (a) patterning the periphery of a film carrier with a plurality of windows and a plurality of conductors, each conductor having a bent-up tab and an end portion terminating at the periphery within the respective window; and
    (b) mounting an inductor core having a plurality of insulated windings to the film carrier by attaching each winding to the respective bent-up tab of each conductor.

8. A method for producing an inductor and carrier suitable for attaching to a mounting substrate as in claim 7 wherein the step of patterning the periphery of the film carrier comprises etching of the periphery of the film carrier.

9. A method for producing an inductor and carrier suitable for attaching to a mounting substrate as in claim 7 wherein the step of patterning the periphery of the film carrier comprises etching and laser skiving of the periphery of the film carrier.

10. A method for producing an inductor and carrier suitable for attaching to a mounting substrate as in claim 7 wherein the step of mounting the inductor core by attaching each winding to the respective bent-up tab of each conductor comprises soldering each winding to the respective bent-up tab of each conductor.

11. A method for producing an inductor and carrier suitable for attaching to a mounting substrate as in claim 7 further comprising the step of:
    welding the end portion of each conductor to bonding pads on a mounting substrate.

12. A method for producing an inductor and carrier suitable for attaching to a mounting substrate as in claim 7 further comprising the step of:
    depositing a solder resist zone on the middle portion of the film carrier before the insulated windings are soldered to the respective bent-up tabs of each conductor.

* * * * *